(12) United States Patent
Blatchford

(10) Patent No.: US 8,372,743 B2
(45) Date of Patent: Feb. 12, 2013

(54) HYBRID PITCH-SPLIT PATTERN-SPLIT LITHOGRAPHY PROCESS

(75) Inventor: James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/410,145

(22) Filed: Mar. 1, 2012

(65) Prior Publication Data

US 2012/0225550 A1    Sep. 6, 2012

Related U.S. Application Data

(60) Provisional application No. 61/448,451, filed on Mar. 2, 2011.

(51) Int. Cl.
*H01L 21/4763* (2006.01)

(52) U.S. Cl. ........ 438/622; 438/637; 438/708; 438/717; 438/720; 438/736; 438/742; 257/E21.576; 257/E21.577

(58) Field of Classification Search .................. None
See application file for complete search history.

(56) References Cited

U.S. PATENT DOCUMENTS

| | | | |
|---|---|---|---|
| 6,403,413 B2 * | 6/2002 | Hayano et al. ................. | 438/238 |
| 6,632,744 B2 * | 10/2003 | Imai et al. ..................... | 438/692 |
| 6,653,238 B2 * | 11/2003 | Kim et al. ...................... | 438/700 |
| 7,351,666 B2 * | 4/2008 | Furukawa et al. ............. | 438/736 |
| 7,534,723 B2 * | 5/2009 | Park et al. ...................... | 438/669 |
| 7,829,168 B2 * | 11/2010 | Zhang et al. .................. | 428/64.1 |
| 7,928,007 B2 * | 4/2011 | Petti .............................. | 438/645 |

OTHER PUBLICATIONS

James W. Blatchford, Steven L. Prins, Scott W. Jessen, Thuc Dam, KiHo Baik, Linyong Pang and Bob Gleason, "Litho/Design Co-optimization and Area Scaling for the 22-nm Logic Node", Presented at the China Semiconductor International Conference 2010, Mar. 16-18, 2010, Shanghai, China, ECS Transactions 27 (1), 449 (2010). Published by The Electrochemical Society, Pennington, NJ.

* cited by examiner

*Primary Examiner* — Zandra Smith
*Assistant Examiner* — Khanh Duong
(74) *Attorney, Agent, or Firm* — Jacqueline J. Garner; Wade J. Brady, III; Frederick J. Telecky, Jr.

(57) ABSTRACT

An integrated circuit may be formed by a process of forming a three interconnect patterns in a plurality of parallel route tracks, using photolithography processes which have illumination sources capable of a pitch distance twice the pitch distance of the parallel route tracks. The first interconnect pattern includes a first lead pattern which extends to a first point. The second interconnect pattern includes a second lead pattern which is parallel to and immediately adjacent to the first lead pattern. The third interconnect pattern includes a third lead pattern which is parallel to and immediately adjacent to the second pattern and which extends to a second point in the first instance of the parallel route tracks, laterally separated from the first point by a distance less than one and one-half times a space between adjacent patterns in the parallel route tracks.

17 Claims, 10 Drawing Sheets

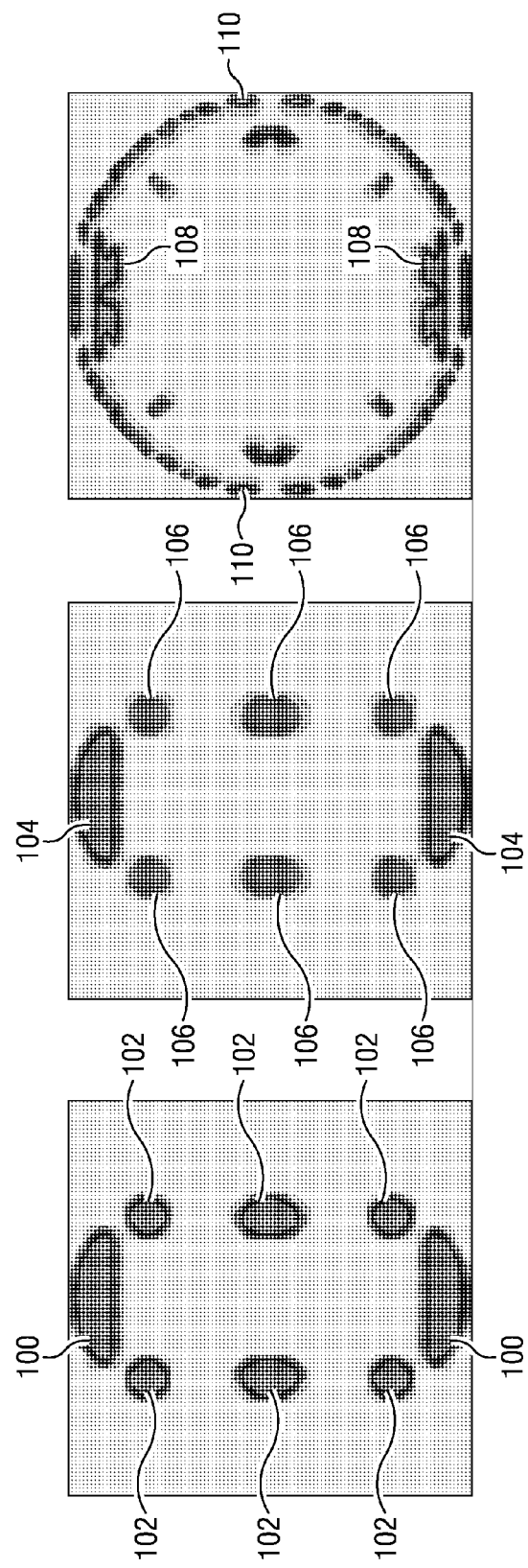

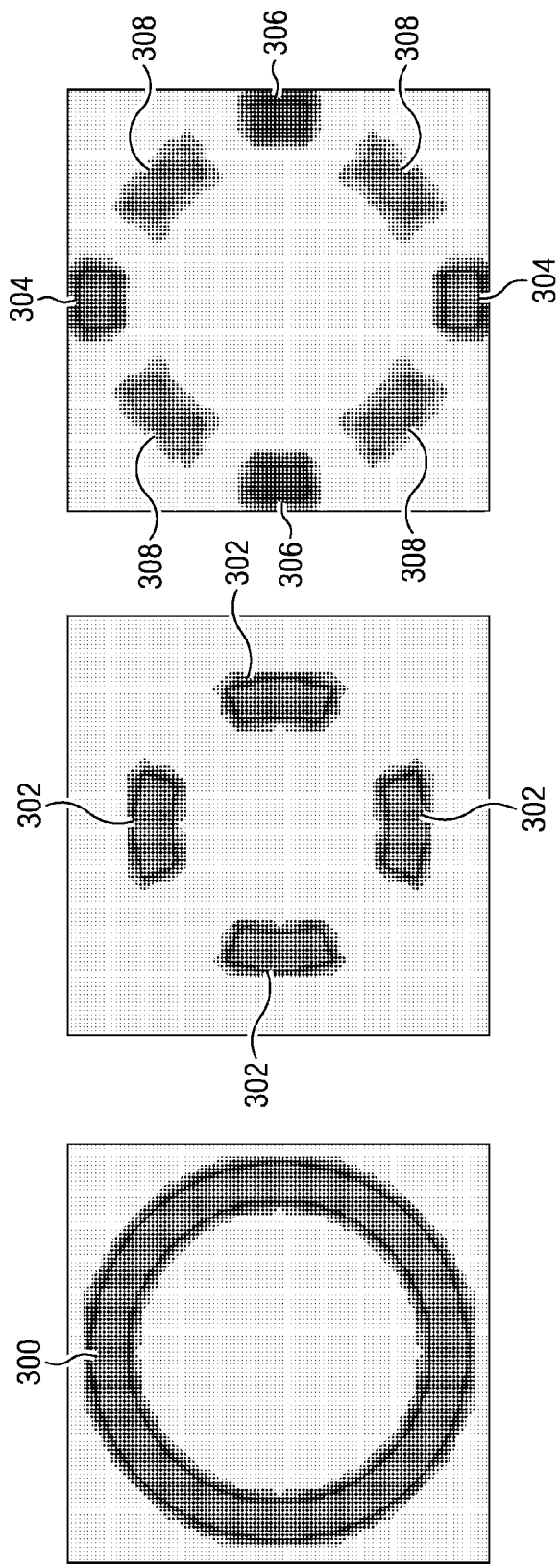

HYBRID PITCH-SPLIT PATTERN-SPLIT LITHOGRAPHY PROCESS

CROSS-REFERENCE TO RELATED APPLICATIONS

This application claims the benefit of priority under U.S.C. §119(e) of U.S. Provisional Application 61/448,451, filed Mar. 2, 2011.

The following applications are related and hereby incorporated by reference:

patent application Ser. No. 13/410,241 (filed Mar. 1, 2012) entitled "TWO-TRACK CROSS-CONNECT IN DOUBLE-PATTERNED STRUCTURE USING RECTANGULAR VIA,"

patent application Ser. No. 13/410,236 (filed Mar. 1, 2012) entitled "TWO-TRACK CROSS-CONNECTS IN DOUBLE-PATTERNED METAL LAYERS USING A FORBIDDEN ZONE," and patent application Ser. No. 13/410,188 (filed Mar. 1, 2012) entitled "PATTERN-SPLIT DECOMPOSITION STRATEGY FOR DOUBLE-PATTERNED LITHOGRAPHY PROCESS."

FIELD OF THE INVENTION

This invention relates to the field of integrated circuits. More particularly, this invention relates to photolithography processes for forming integrated circuits.

BACKGROUND OF THE INVENTION

Integrated circuits may be formed using photolithography processes with illuminations sources having wavelengths more than twice a desired pitch of metal interconnect lines in the integrated circuits. Attaining desired tradeoffs between fabrication costs and fabrication yield may be difficult. For example, technology nodes at and beyond the 28 nanometer node using 193 nanometer illumination sources may require more than one pattern step to obtain desired first metal interconnect layouts. Forming crossovers between adjacent parallel route tracks and separated lines in the first metal level with desired lateral dimensions may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by a process of forming a first interconnect pattern in a plurality of parallel route tracks, forming a second interconnect pattern in the plurality of parallel route tracks, and forming a third interconnect pattern in the plurality of parallel route tracks. The three interconnect patterns are formed using photolithography processes which have illumination sources capable of resolving features with a pitch distance in a direction perpendicular to the route tracks substantially equal to twice a pitch distance of the parallel route tracks. The first interconnect pattern includes a first lead pattern which extends to a first point in a first instance of the parallel route tracks. The second interconnect pattern includes a second lead pattern which is parallel to and immediately adjacent to the first lead pattern in an immediately adjacent instance of the parallel route tracks. The third interconnect pattern includes a third lead pattern which is parallel to and immediately adjacent to the second pattern in an immediately adjacent instance of the parallel route tracks and which extends to a second point in the first instance of the parallel route tracks, such that the second point is laterally separated from the first point by a distance less than one and one-half times a space between adjacent instances of the interconnect patterns in the parallel route tracks. A metal interconnect formation process is performed which forms metal interconnect lines in an interconnect level defined by the first interconnect pattern, the second interconnect pattern and the third interconnect pattern. A first lead of the metal interconnect lines is formed in the first lead pattern and extends to the first point. A second lead of the metal interconnect lines is formed in the second lead pattern. A third lead of the metal interconnect lines is formed in the third lead pattern and extends to the second point.

DESCRIPTION OF THE VIEWS OF THE DRAWING

FIG. 1A through FIG. 1C depict exemplary illumination sources for photolithographic processes which may be used to form integrated circuits according to embodiments described herein.

FIG. 3A through FIG. 3C depict exemplary illumination sources for photolithographic processes which may be used to form integrated circuits according to embodiments described herein.

DETAILED DESCRIPTION OF EXAMPLE EMBODIMENTS

Figure 2A:
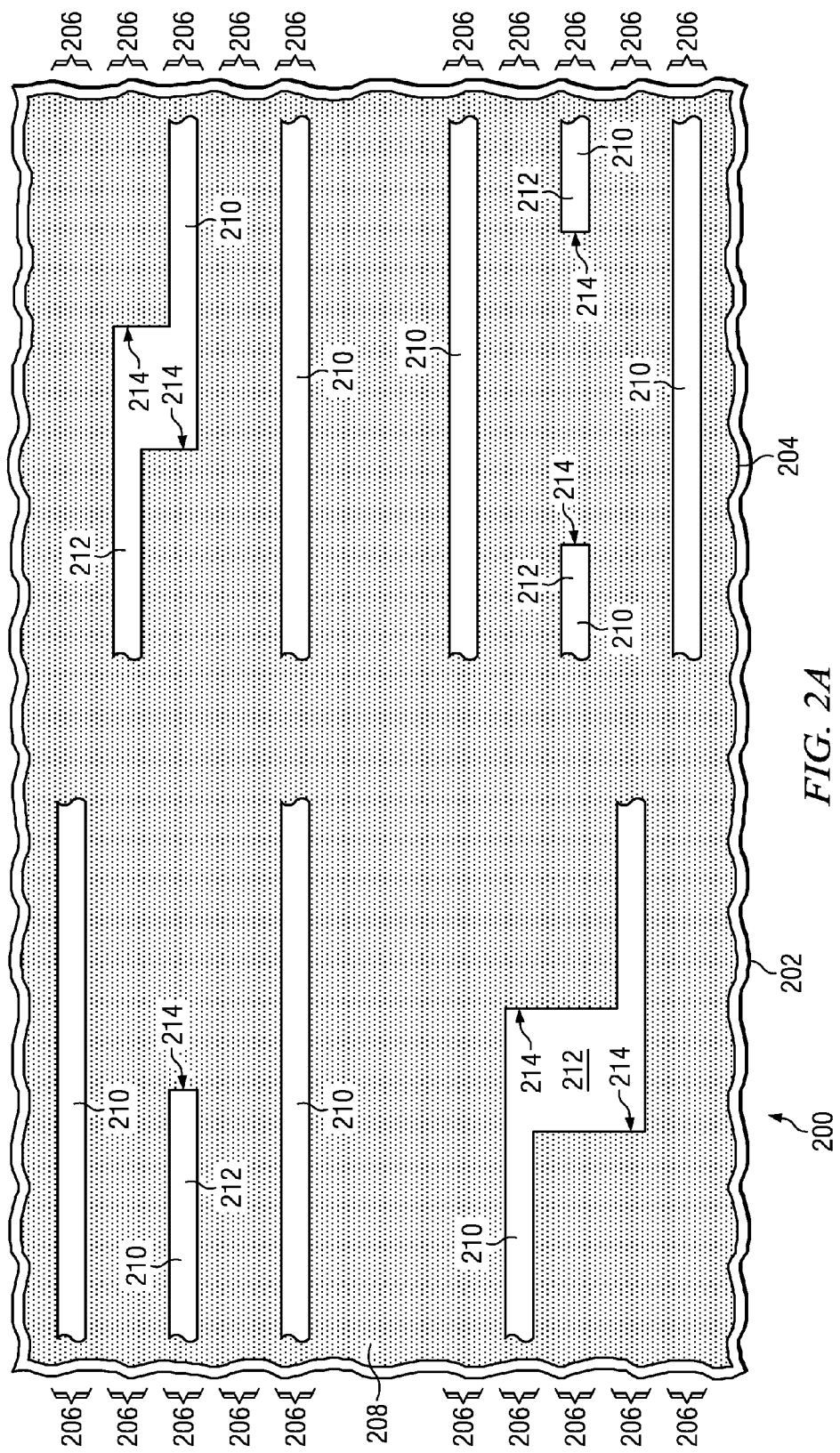
FIG. 2A through FIG. 2G are top views of an integrated circuit formed according a first embodiment using a damascene metal process and an illumination source with a dipole component, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed by a process of forming a first interconnect pattern in a plurality of parallel route tracks, forming a second interconnect pattern in the plurality of parallel route tracks, and forming a third interconnect pattern in the plurality of parallel route tracks. The three interconnect patterns are formed using photolithography processes which have illumination sources capable of resolving features with a pitch distance in a direction perpendicular to the route tracks equal to twice a pitch distance of the parallel route tracks. The first interconnect pattern includes a first lead pattern which extends to a first point in a first instance of the parallel route tracks. The second interconnect pattern includes a second lead pattern which is parallel to and immediately adjacent to the first lead pattern in an immediately adjacent instance of the parallel route tracks. The third interconnect pattern includes a third lead pattern which is parallel to and immediately adjacent to the second pattern in an immediately adjacent instance of the parallel route tracks and which extends to a second point in the first instance of the parallel route tracks, such that the second point is laterally separated from the first point by a distance less than one and one-half times a space between adjacent instances of the interconnect patterns in the parallel route tracks. A metal interconnect formation process is performed which forms metal interconnect lines in an interconnect level defined by the first interconnect pattern and the second interconnect pattern. A first lead of the metal interconnect lines is formed in the first lead pattern and extends to the first point. A second lead of the metal interconnect lines is formed in the second lead pattern. A third lead of the metal interconnect lines is formed in the third lead pattern and extends to the second point.

FIG. 1A through FIG. 1C depict exemplary illumination sources for photolithographic processes which may be used to form integrated circuits according to embodiments described herein. FIG. 1A depicts an off-axis illumination source with a moderate dipole component; the emitting area is configured in two large dipole regions 100 along the vertical direction and smaller source regions 102 along the horizontal and diagonal directions. FIG. 1B depicts an off-axis illumination source with a strong dipole component; the emitting area is configured in two large dipole regions 104 along the vertical direction and smaller, weaker source regions 106 along the horizontal and diagonal directions. FIG. 1C depicts an off-axis illumination source with a dipole component; the emitting area is configured in two dipole regions 108 along the vertical direction and a distributed annular region 110.

FIG. 2A through FIG. 2G are top views of an integrated circuit formed according to a first embodiment using a damascene metal process and an illumination source with a dipole component, depicted in successive stages of fabrication. The instant embodiment uses an illumination source with a dipole component, for example any of the illuminations sources described in reference to FIG. 1A through FIG. 1C. Referring to FIG. 2A, the integrated circuit 200 is formed in and on a semiconductor substrate 202, which may be, for example, a single crystal silicon wafer, a silicon wafer with silicon-germanium regions, a silicon-on-insulator (SOI) wafer, a hybrid orientation technology (HOT) wafer with regions of different crystal orientations, or other material appropriate for fabrication of the integrated circuit 200.

A dielectric layer 204 is formed over the substrate 202. The dielectric layer 204 may be a stack of dielectric sub-layers, and may include, for example a pre-metal dielectric (PMD) layer and an inter-level dielectric (ILD) layer. The PMD layer may include a PMD liner, a PMD main layer, and an optional PMD cap layer, not shown. The PMD liner may include silicon nitride or silicon dioxide, 10 to 100 nanometers thick, deposited by plasma enhanced chemical vapor deposition (PECVD) on an existing top surface of the integrated circuit 200. The PMD main layer may be a layer of silicon dioxide formed by a high aspect ration process (HARP) followed by a layer of silicon dioxide, phospho-silicate glass (PSG) or boro-phospho-silicate glass (BPSG), commonly 100 to 1000 nanometers thick, deposited by a PECVD process on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer.

The ILD layer may include, for example, an etch stop layer of 5 to 25 nanometers of silicon nitride, silicon carbide, or silicon carbide nitride, a main layer of 100 to 200 nanometers of low-k dielectric material such as organo-silicate glass (OSG), carbon-doped silicon oxides (SiCO or CDO) or dielectric material formed from methylsilsesquioxane (MSQ), or possibly ultra low-k dielectric material such as porous OSG (p-OSG), and a cap layer of 10 to 40 nanometers of silicon nitride, silicon carbide nitride or silicon carbide.

Areas for a plurality of parallel route tracks 206 are defined over the integrated circuit 200. A first interconnect pattern 208, depicted in FIG. 2A with a stipple pattern, is formed of photoresist over the dielectric layer 204 which creates a first plurality of exposed areas 210 in the parallel route tracks 206. A photolithography process used to form the first interconnect pattern 208 is capable of forming lead patterns in the parallel route tracks 206 with a pitch distance in a direction perpendicular to the route tracks 206 substantially equal to twice a pitch distance of the parallel route tracks 206, so that an instance of the first plurality of exposed areas 210 in an instance of the parallel route tracks 206 is free of instances of the first plurality of exposed areas 210 immediately adjacent to the exposed areas 210 instance in an immediately adjacent instance of the parallel route tracks 206.

The first plurality of exposed areas 210 includes instances of first lead patterns 212 in instances of the of parallel route tracks 206. The first lead patterns 212 extend to instances of a first point 214 in instances of the parallel route tracks 206. The first lead patterns 212, for example, may terminate at the first point 214 or may branch at the first point 214 to another instance of the parallel route tracks 206.

In one version of the instant embodiment, the first interconnect pattern 208 may be formed of an amplified photoresist suitable for 193 nanometer radiation, and developed using a positive tone develop process such as exposure to an alkaline aqueous developing solution. In another version, the first interconnect pattern 208 may be formed of photoresist and developed using a negative tone develop process. In one version of the instant embodiment, the illumination source may provide 193 nanometer radiation, and the pitch distance of the parallel route tracks 206 may be 40 to 42 nanometers.

Figure 2B:
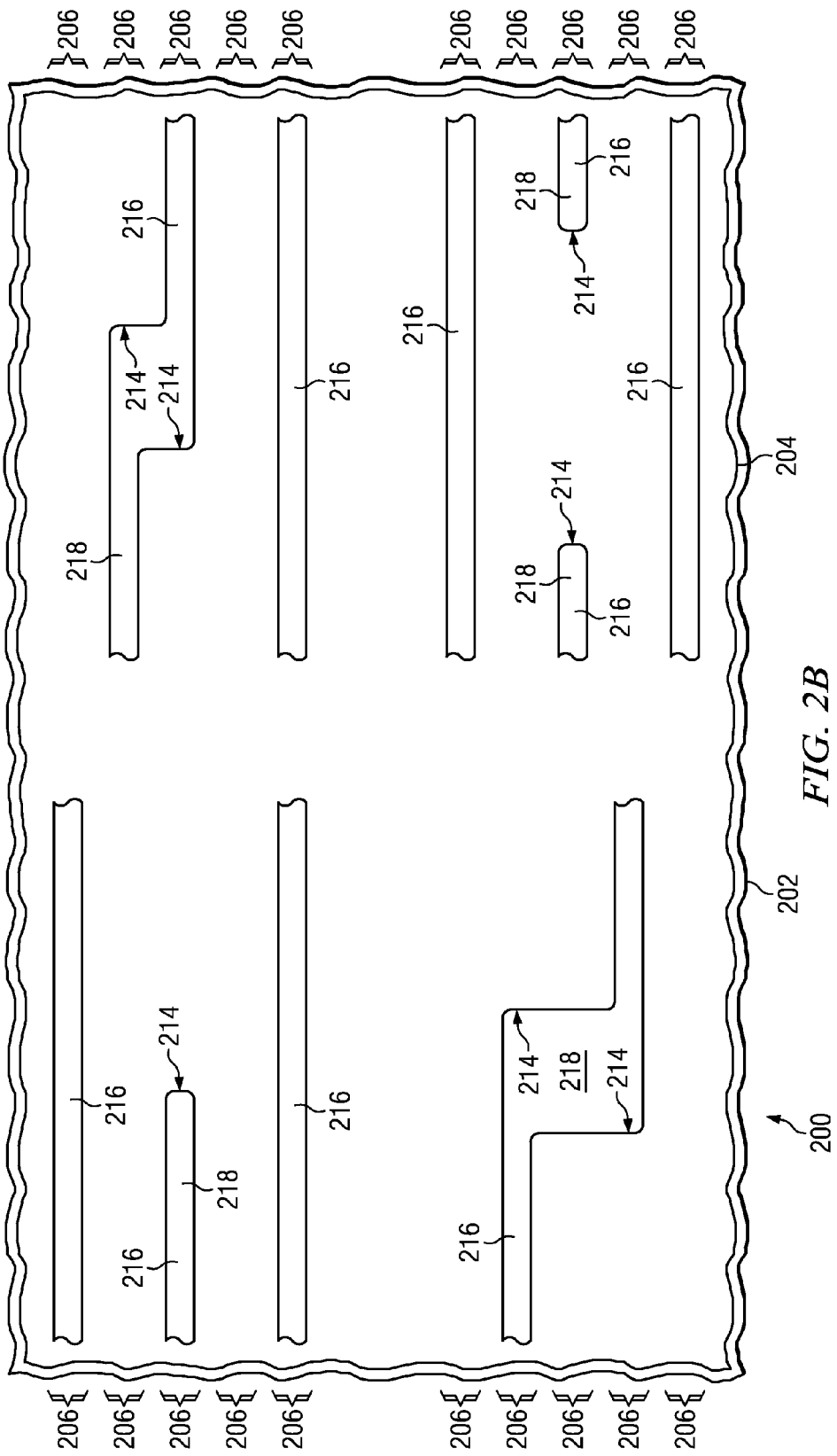

Referring to FIG. 2B, a first interconnect trench etch process is performed which removes dielectric material from the dielectric layer 204 in the first plurality of exposed areas 210 to form a first plurality of interconnect trenches 216. The first plurality of interconnect trenches 216 includes instances of first lead trenches 218, formed in areas defined by the first lead patterns 212, which extend to the instances of the first point 214. The first interconnect pattern 208 is removed after the first interconnect trench etch process is completed, for example by exposing the integrated circuit 200 to an oxygen containing plasma, followed by a wet cleanup to remove any organic residue from the top surface of the dielectric layer 204.

Figure 2C:
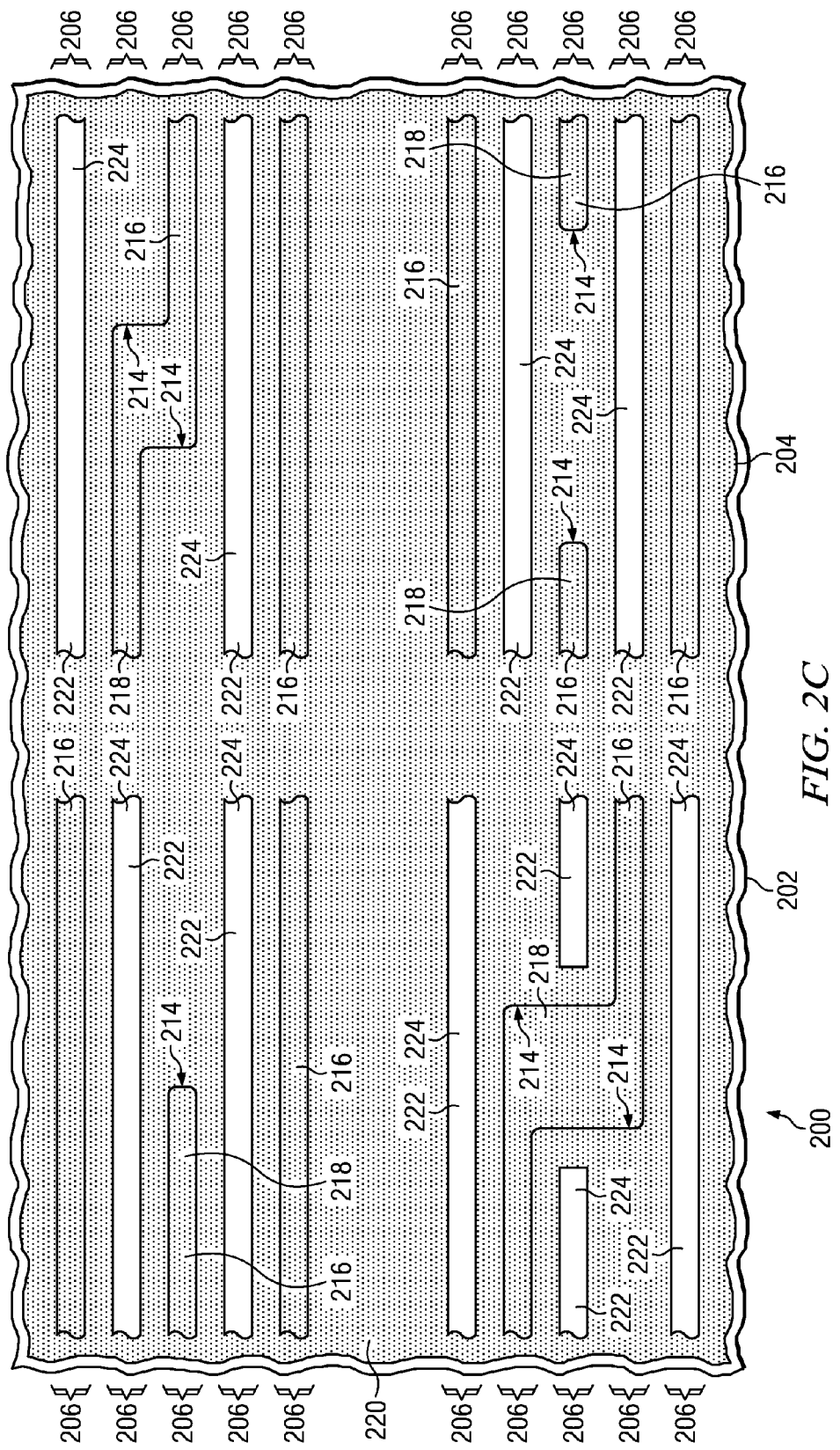

Referring to FIG. 2C, a second interconnect pattern 220, depicted in FIG. 2C with a stipple pattern, is formed of photoresist over the dielectric layer 204 which creates a second plurality of exposed areas 222 in the parallel route tracks 206.

A photolithography process used to form the second interconnect pattern 220 has similar resolution characteristics as the photolithography process used to form the first interconnect pattern 208, so that an instance of the second plurality of exposed areas 222 in an instance of the parallel route tracks 206 is free of instances of the second plurality of exposed areas 222 immediately adjacent to the exposed areas 222 instance in an immediately adjacent instance of the parallel route tracks 206. The second plurality of exposed areas 222 includes instances of second lead patterns 224 which are parallel to and immediately adjacent to the instances of the first lead patterns 212, and hence to the instances of the first lead trenches 218, in immediately adjacent instances of the parallel route tracks 206.

Figure 2D:
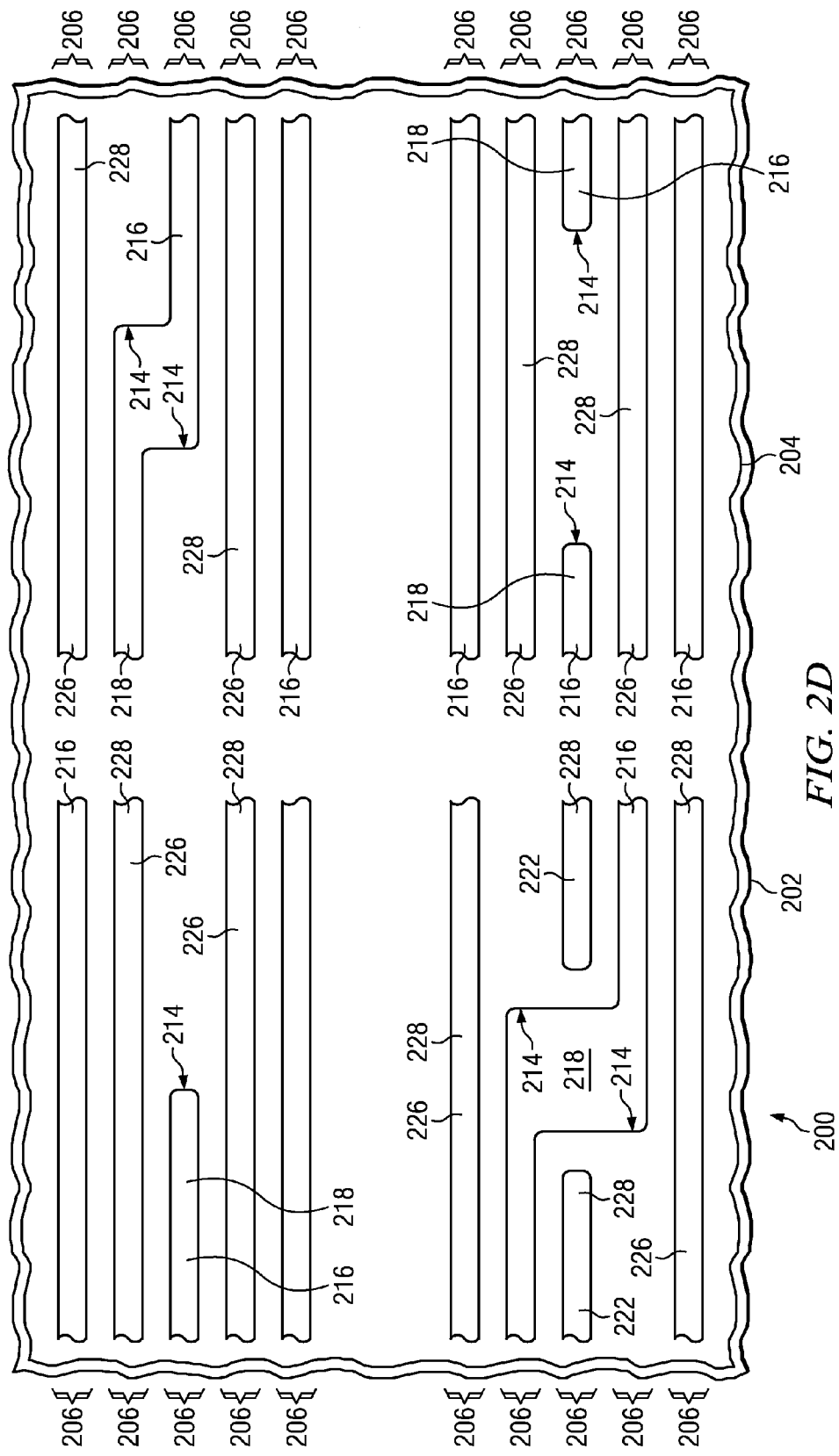

Referring to FIG. 2D, a second interconnect trench etch process is performed which removes dielectric material from the dielectric layer 204 in the second plurality of exposed areas 222 to form a second plurality of interconnect trenches 226, including a second plurality of second lead trenches 228 in areas defined by the second lead patterns 224. The second lead trenches 228 are parallel to and immediately adjacent to the instances of the first lead trenches 218 in immediately adjacent instances of the parallel route tracks 206. The second interconnect pattern 220 is removed after the second interconnect trench etch process is completed, for example as described in reference to FIG. 2B.

Figure 2E:
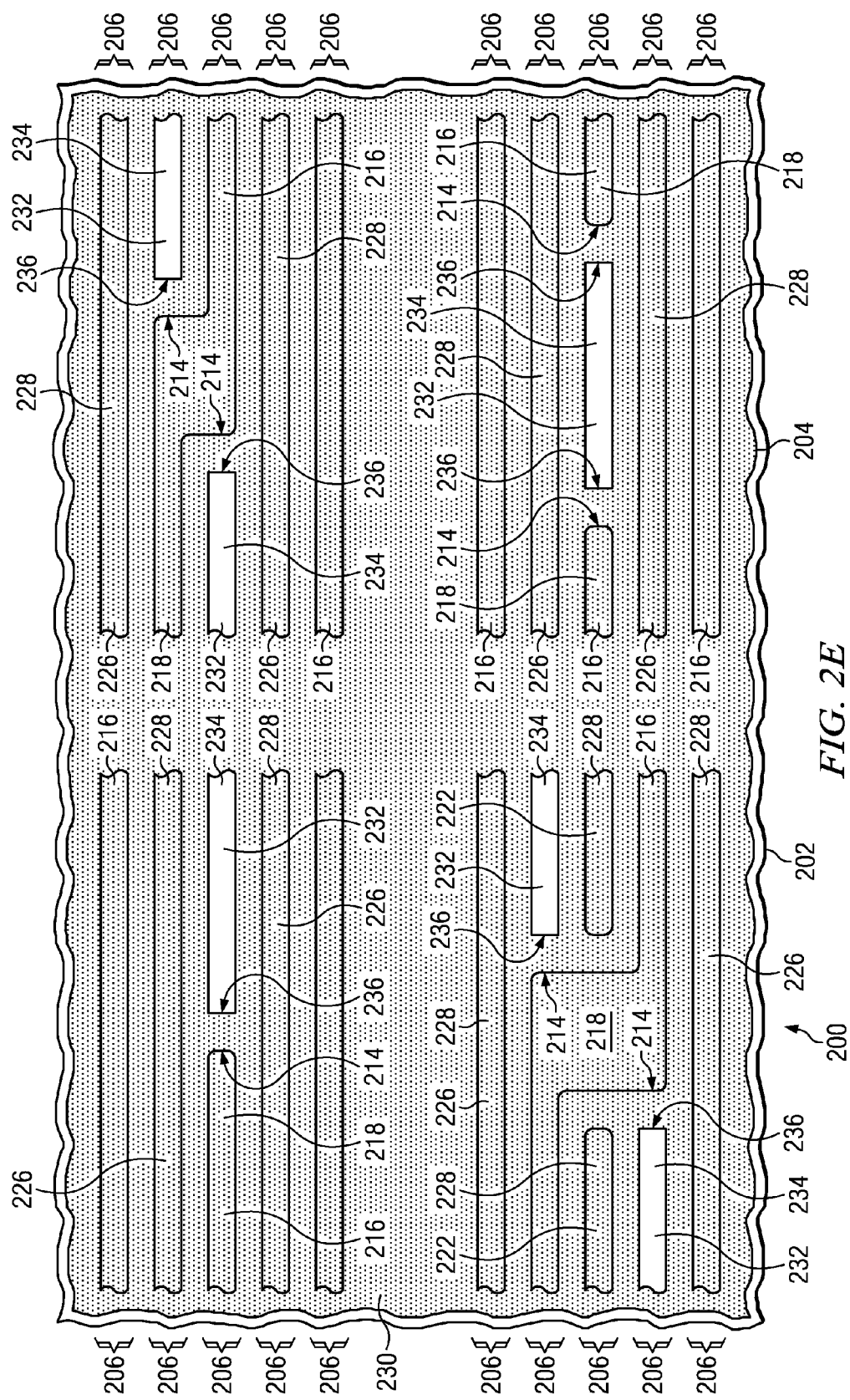

Referring to FIG. 2E, a third interconnect pattern 230, depicted in FIG. 2C with a stipple pattern, is formed of photoresist over the dielectric layer 204 which creates a third plurality of exposed areas 232 in the parallel route tracks 206. A photolithography process used to form the third interconnect pattern 230 has similar resolution characteristics as the photolithography process used to form the first interconnect pattern 208, so that an instance of the third plurality of exposed areas 232 in an instance of the parallel route tracks 206 is free of instances of the third plurality of exposed areas 232 immediately adjacent to the exposed areas 232 instance in an immediately adjacent instance of the parallel route tracks 206. The third plurality of exposed areas 232 includes instances of third lead patterns 234 which are parallel to and immediately adjacent to the instances of the second lead pattern 224, and hence to the instances of the second lead trenches 228, in an immediately adjacent instance of the parallel route tracks 206 and which extend to instances of a second point 236 proximate to the instances of the first point 214 in the same instances of the route tracks containing the instances of the first point 214, such that the instances of the second point 236 are laterally separated from corresponding instances of the first point 214 by a distance less than one and one-half times a space between adjacent instances of the interconnect patterns in the parallel route tracks 206. In one version of the instant embodiment, the instances of the second point 236 may be laterally separated from corresponding instances of the first point 214 by a distance less than the space between adjacent instances of the interconnect patterns in the parallel route tracks 206.

Figure 2F:
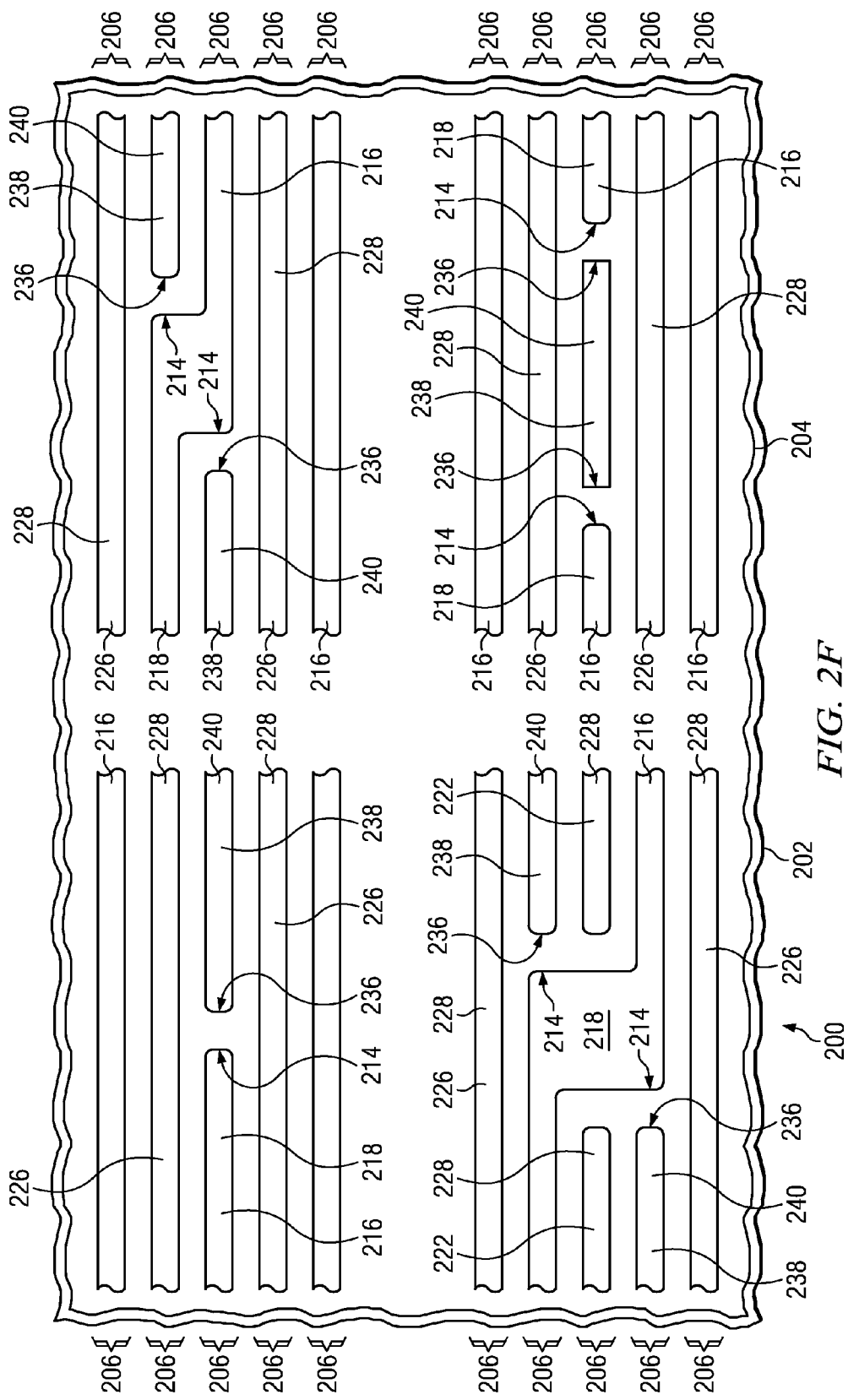

Referring to FIG. 2F, a third interconnect trench etch process is performed which removes dielectric material from the dielectric layer 204 in the third plurality of exposed areas 232 to form a third plurality of interconnect trenches 238, including a third plurality of third lead trenches 240 in areas defined by the third lead patterns 234. The third lead trenches 240 are parallel to and immediately adjacent to the instances of the second lead trenches 228 in an immediately adjacent instance of the parallel route tracks 206 and extend to instances of the second point 236 proximate to the instances of the first point 214 in the same instances of the route tracks containing the instances of the first point 214. The third interconnect pattern 230 is removed after the third interconnect trench etch process is completed, for example as described in reference to FIG. 2B. It will be recognized that the three interconnect patterns 208, 220 and 230 and corresponding interconnect trench etch processes may be performed in any order so as to provide the configuration of interconnect trenches depicted in FIG. 2F.

Figure 2G:
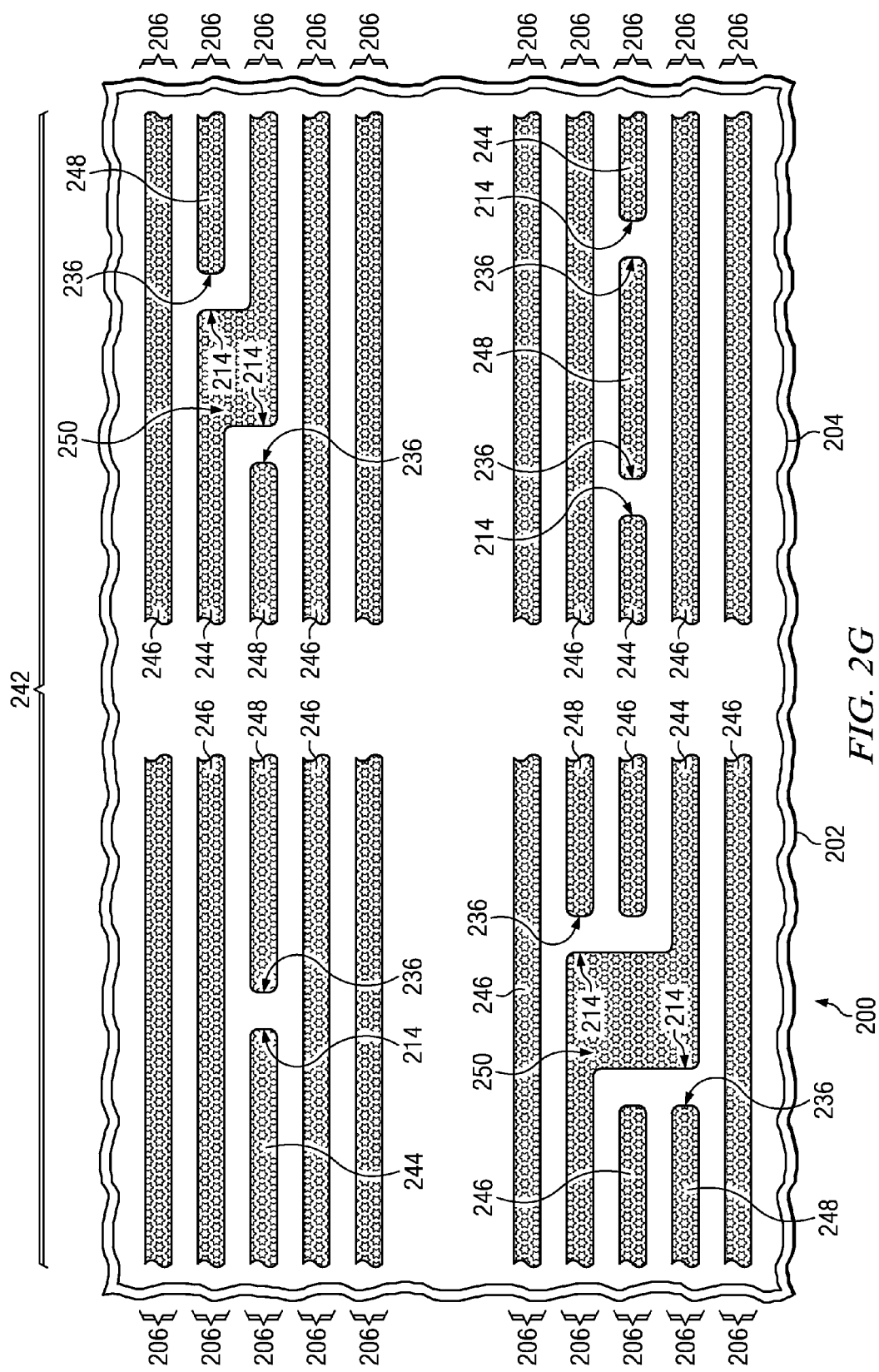

Referring to FIG. 2G, a damascene metal interconnect formation process is performed which forms metal interconnect lines 242 in the first plurality of interconnect trenches 216, the second plurality of interconnect trenches 226 and the third plurality of interconnect trenches 238. The metal interconnect lines 242 are depicted in FIG. 2E with a star hatch pattern. The damascene metal interconnect formation process may include, for example, forming a tantalum nitride liner 1 to 5 nanometers thick in the first plurality of interconnect trenches 216, the second plurality of interconnect trenches 226 and the third plurality of interconnect trenches 238 by an atomic layer deposition (ALD) process, forming a copper seed layer 5 to 80 nanometers thick on the liner by sputtering, electroplating copper on the seed layer so as to fill the first plurality of interconnect trenches 216, the second plurality of interconnect trenches 226 and the third plurality of interconnect trenches 238, and subsequently removing copper and liner metal from a top surface of the dielectric layer 204 by a copper CMP process.

The metal interconnect lines 242 include a plurality of first leads 244 formed in the first lead trenches 218, a plurality of second leads 246 formed in the second lead trenches 228 and a plurality of third leads 248 formed in the third lead trenches 240. The first leads 244 extend to the instances of the first point 214 in instances of the parallel route tracks 206. The second leads 246 are parallel to and immediately adjacent to the instances of the first leads 244 in immediately adjacent instances of the parallel route tracks 206. The third leads 248 are parallel to and immediately adjacent to the instances of the second leads 246 in an immediately adjacent instance of the parallel route tracks 206 and extend to the instances of the second point 236 proximate to the instances of the first point 214 in the same instances of the route tracks containing the instances of the first point 214.

Crossover segments 250 may have a minimum width parallel to the route tracks 206 that is greater than twice the width of the metal interconnect lines 242 in the route tracks 206 because of the dipole configuration of the illumination sources used to form the interconnect patterns 208, 220 and 230. The crossover segments 250 may, for example, extend to two adjacent instances of the parallel route tracks 206, or may extend to two instances of the parallel route tracks which are separated by another instance of the parallel route tracks 206.

Forming the metal interconnect lines 242 using the three interconnect patterns and three interconnect trench etch processes as described in reference to FIG. 2A through FIG. 2G may desirably provide configuration of the metal interconnect lines 242 in less space on the integrated circuit 200 than other configurations of the metal interconnect lines 242 formed by two interconnect patterns and two interconnect trench etch processes. Forming the metal interconnect lines 242 in less space may advantageously provide a lower cost of the integrated circuit 200.

FIG. 3A through FIG. 3C depict exemplary illumination sources for photolithographic processes which may be used to form integrated circuits according to embodiments described herein. FIG. 3A depicts an isotropic off-axis illumination source, in which the emitting area 300 has an annular configuration. FIG. 3B depicts a quadruple off-axis illumination source, in which the emitting area 302 is configured in four regions uniformly spaced around an optical axis of the illumination source so as to provide substantially equal spatial resolution in both horizontal and vertical directions. FIG. 3C depicts a composite dipole-quadrupole-octopole off-axis illumination source, in which the emitting area is configured in two strong emitting regions 304 along the vertical direction, two moderate emitting regions 306 along the horizontal direction, and four weak emitting regions 308 along diagonal directions.

Figure 4:
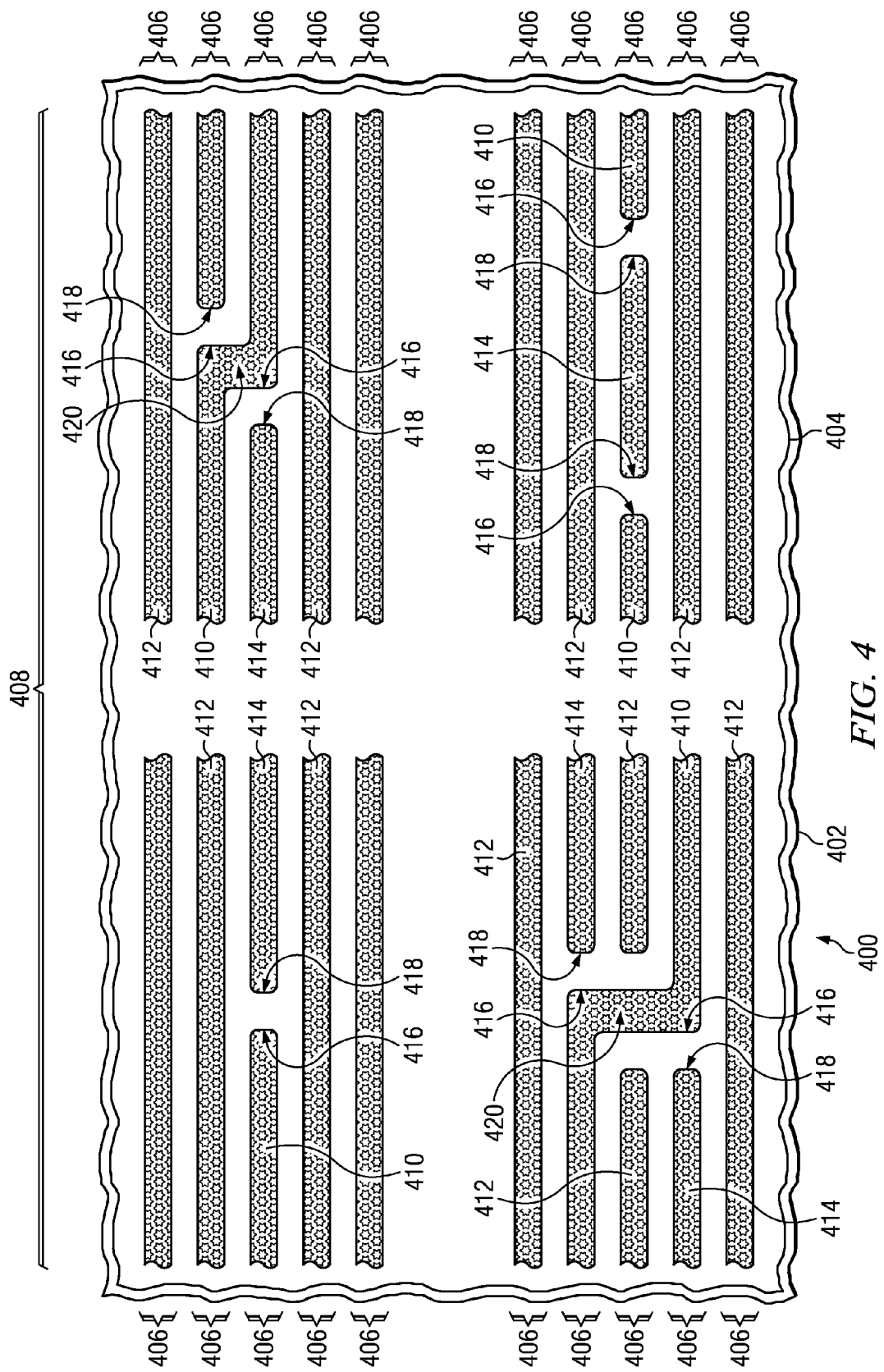
FIG. 4 is a top view of an integrated circuit formed according the process described in reference to FIG. 2A through FIG. 2G using an isotropic illumination source, for example any of the illuminations sources described in reference to FIG. 3A through FIG. 3C.

FIG. 4 is a top view of an integrated circuit formed according the process described in reference to FIG. 2A through FIG. 2G using an isotropic illumination source, for example any of the illuminations sources described in reference to FIG. 3A through FIG. 3C. Referring to FIG. 4, the integrated circuit 400 is formed in and on a semiconductor substrate 402 with a dielectric layer 404 is formed over the substrate 402 as described in reference to FIG. 2A. Areas for a plurality of parallel route tracks 406 are defined over the integrated circuit 400.

Metal interconnect lines 408 are formed in the dielectric layer 404 using three photolithographic processes and three interconnect trench etch process followed by a damascene metal interconnect formation process, as described in reference to FIG. 2A through FIG. 2G. The metal interconnect lines 408 are depicted in FIG. 4 with a star hatch pattern. The metal interconnect lines 408 include a plurality of first leads 410 defined by a first interconnect pattern, a plurality of second leads 412 defined by a second interconnect pattern, and a plurality of third leads 414 defined by a third interconnect pattern. The first leads 410 extend to the instances of a first point 416 in instances of the parallel route tracks 406. The second leads 412 are parallel to and immediately adjacent to the instances of the first leads 410 in immediately adjacent instances of the parallel route tracks 406. The third leads 414 are parallel to and immediately adjacent to the instances of the second leads 412 in an immediately adjacent instance of the parallel route tracks 406 and extend to the instances of a second point 418 proximate to the instances of the first point 416 in the same instances of the route tracks containing the instances of the first point 416, such that the instances of the second point 418 are laterally separated from corresponding instances of the first point 416 by a distance less than one and one-half times a space between adjacent metal interconnect lines 408 in the parallel route tracks 406.

Crossover segments 420 may have a minimum width parallel to the route tracks 406 that is less than one and one-half times a width of the metal interconnect lines 408 in the route tracks 406 because of the isotropic configuration of the illumination sources used to form the interconnect patterns. Forming the metal interconnect lines 408 using the three interconnect patterns and three interconnect trench etch processes as described in reference to FIG. 2A through FIG. 2G with isotropic illumination sources may desirably provide configuration of the metal interconnect lines 408 in less space on the integrated circuit 400 than other configurations of the metal interconnect lines 408 formed by two interconnect patterns and two interconnect trench etch processes. Forming the metal interconnect lines 408 in less space may advantageously provide a lower cost of the integrated circuit 400.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps of:
    forming a dielectric layer over a substrate;
    defining a plurality of parallel route tracks having a pitch distance in said dielectric layer;
    forming a first interconnect pattern in said plurality of parallel route tracks including a first lead pattern located in a first route track of said plurality of parallel route tracks;
    forming a second interconnect pattern in said plurality of parallel route tracks including a second lead pattern located in a second route track of said plurality of parallel route tracks immediately adjacent to said first route track;
    forming a third interconnect pattern in said plurality of parallel route tracks including a third lead pattern located in said first route track, wherein said third lead pattern is separated from said first lead pattern in the first route track by a distance less than one and one-half times a space between said first lead pattern and said second lead pattern;
    wherein said first interconnect pattern, said second interconnect pattern and said third interconnect pattern are formed using three distinct photolithography processes which have a dipole illumination source capable of resolving patterns in alternate instances of said plurality of parallel route tracks and not capable of resolving patterns in immediately adjacent instances of said plurality of parallel route tracks; and
    forming metal interconnect lines in said dielectric layer as defined by said first interconnect pattern, said second interconnect pattern and said third interconnect pattern.

2. The process of claim 1, in which:
    said dipole illumination source provides 193 nanometer radiation; and
    said pitch distance of said plurality of parallel route tracks is 40 to 42 nanometers.

3. The process of claim 1, wherein said first lead pattern terminates at a point in the first route track that is at said distance from said third lead pattern.

4. The process of claim 1, wherein said first lead pattern branches to form a crossover at a point in the first route track that is at said distance from said third lead pattern.

5. The process of claim 4, wherein said crossover extends to a third route track on an opposite side of said second route track from said first route track.

6. The process of claim 4, in which said crossover has a minimum width parallel to said first route track that is greater than said pitch distance.

7. The process of claim 4, in which said crossover has a minimum width parallel to said first route track that is less than two-thirds of said pitch distance.

8. A process of forming an integrated circuit, comprising the steps of:
    forming a dielectric layer over a substrate;
    defining a plurality of parallel route tracks in said dielectric layer including a first route track, a second route track and a third route track, wherein said second route track is immediately adjacent said first route track and said third route track, said plurality of parallel route tracks having a pitch distance;

forming a first interconnect pattern creating a plurality of first exposed areas including a first lead pattern, wherein said first lead pattern is located in a first portion of said second route track;
performing a first trench etch process to form a plurality of first interconnect trenches in said plurality of first exposed areas;
forming a second interconnect pattern creating a plurality of second exposed areas including a second lead pattern, wherein said second lead pattern is located in a first portion of said third route track adjacent said first portion of the first route track;
performing a second trench etch process to form a plurality of second interconnect trenches in said plurality of second exposed areas;
forming a third interconnect pattern creating a plurality of third exposed areas including a third lead pattern located in said second route track, wherein said third lead pattern is separated from said first lead pattern by a distance of less than one and one-half times a space between said first lead pattern and said second lead pattern;
wherein said first interconnect pattern, said second interconnect pattern and said third interconnect pattern are formed using three distinct photolithography processes which have a dipole illumination source capable of resolving patterns in alternate instances of said plurality of parallel route tracks and not capable of resolving patterns in immediately adjacent instances of said plurality of parallel route tracks;
performing a third trench etch process to form a plurality of third interconnect trenches in said plurality of third exposed areas; and
forming metal interconnect lines in said first interconnect trenches, said second interconnect trenches and said third interconnect trenches.

9. The process of claim 8, wherein no first exposed regions are formed in an adjacent first portion of said first route track.

10. The process of claim 9, wherein said plurality of second exposed areas includes a fourth lead pattern located in said adjacent first portion of the first route track.

11. The process of claim 8, in which the first lead pattern terminates at a first point.

12. The process of claim 8, in which the first lead pattern branches at a first point.

13. The process of claim 12, in which said first lead pattern branches to form a crossover.

14. The process of claim 8, in which:
said dipole illumination source provides 193 nanometer radiation; and
said pitch distance is 40 to 42 nanometers.

15. A process of forming an integrated circuit, comprising the steps of:
forming a dielectric layer over a substrate;
defining a plurality of parallel route tracks in said dielectric layer having a pitch distance;
forming a first interconnect pattern creating a plurality of first exposed areas in said plurality of parallel route tracks wherein each of said first exposed areas is physically separated from all other instances of said plurality of first exposed areas by a distance greater than said pitch distance;
performing a first trench etch process to form a first plurality of trenches in said plurality of first exposed areas;
forming a second interconnect pattern creating a plurality of second exposed areas in said plurality of parallel route tracks wherein each of said second exposed areas is physically separated from all other instances of said plurality of second exposed areas by a distance greater than said pitch distance;
performing a second trench etch process to form a second plurality of trenches in said plurality of second exposed areas;
forming a third interconnect pattern creating a plurality of third exposed areas in said plurality of parallel route tracks, each of a subset of said plurality of third exposed areas being separated from a corresponding first exposed area by a lateral distance less than one and one-half times a space between adjacent instances of interconnect patterns in said parallel route tracks, wherein each of said third exposed areas is physically separated from all other instances of said plurality of third exposed areas by a distance greater than said pitch distance;
wherein said first interconnect pattern, said second interconnect pattern and said third interconnect pattern are formed using three distinct photolithography processes which have a dipole illumination source capable of resolving patterns in alternate instances of said parallel route tracks and not capable of resolving patterns in immediately adjacent instances of said parallel route tracks;
performing a third trench etch process to form a third plurality of trenches in said plurality of third exposed areas; and
forming metal interconnect lines in said first plurality of interconnect trenches, said second plurality of interconnect trenches and said third plurality of interconnect trenches.

16. The process of claim 15, wherein a subset of said plurality of second exposed areas are each located in an instance of said plurality of parallel route tracks immediately adjacent to a corresponding first exposed region.

17. The process of claim 15, in which:
said illumination source provides 193 nanometer radiation; and
said pitch distance of said parallel route tracks is 40 to 42 nanometers.

* * * * *